United States Patent
Qiu et al.

(10) Patent No.: US 9,372,242 B2
(45) Date of Patent: Jun. 21, 2016

(54) MAGNETOMETER WITH ANGLED SET/RESET COIL

(71) Applicant: MEMSIC, INC., Andover, MA (US)

(72) Inventors: Jiaoming Qiu, N. Maple Grove, MN (US); Yongyao Cai, Acton, MA (US)

(73) Assignee: MEMSIC, INC., Andover, MA (US)

( * ) Notice: Subject to any disclaimer, the term of this patent is extended or adjusted under 35 U.S.C. 154(b) by 527 days.

(21) Appl. No.: 13/890,723

(22) Filed: May 9, 2013

(65) Prior Publication Data

US 2013/0300408 A1    Nov. 14, 2013

Related U.S. Application Data (60) Provisional application No. 61/645,820, filed on May 11, 2012.

(51) Int. Cl.
  *G01R 33/09* (2006.01)
  *G01R 33/07* (2006.01)

(52) U.S. Cl.
  CPC .............. *G01R 33/096* (2013.01); *G01R 33/07* (2013.01); *G01R 33/09* (2013.01); *G01R 33/093* (2013.01); *G01R 33/098* (2013.01)

(58) Field of Classification Search
  CPC .... G01R 33/09; G01R 33/093; G01R 33/098; G01R 33/096; G01R 33/07
  USPC ....................................................... 324/252
  See application file for complete search history.

(56) References Cited

U.S. PATENT DOCUMENTS

| | | | | |
|---|---|---|---|---|
| 3,035,253 A | * | 5/1962 | Devol | G11C 17/02 307/413 |
| 4,361,805 A | * | 11/1982 | Narimatsu | G01D 5/145 324/207.21 |
| 4,492,922 A | * | 1/1985 | Ohkubo | H03K 17/9517 324/207.21 |
| 5,199,178 A | * | 4/1993 | Tong | G01R 33/05 324/247 |
| 5,592,082 A | * | 1/1997 | Kuriyama | G01R 33/09 324/252 |
| 5,719,494 A | * | 2/1998 | Dettmann | G01R 33/022 324/117 R |
| 5,831,426 A | * | 11/1998 | Black, Jr. | G01R 33/09 324/117 R |
| 5,952,825 A | * | 9/1999 | Wan | B82Y 25/00 324/252 |
| 6,404,317 B1 | * | 6/2002 | Mizoguchi | H01F 17/0006 336/200 |
| 6,593,841 B1 | * | 7/2003 | Mizoguchi | H01F 17/0006 336/200 |
| 6,700,371 B2 | * | 3/2004 | Witcraft | G01R 33/09 324/235 |

(Continued)

*Primary Examiner* — Jermele M Hollington
*Assistant Examiner* — Christopher McAndrew
(74) *Attorney, Agent, or Firm* — Preti Flaherty Beliveau Pachios LLP (57) ABSTRACT

A magnetometer with a set/reset coil having portions that cross portions of sensing strips at an angle in order to create a magnetic field in the sensing strip that is at an angle with respect to the easy axis of magnetization of the sensing strip. Each sensing strip may have a portion having a magnetic field created therein that is different from a magnetic field created in another portion of the same sensing strip. As a result, a lower set/reset coil current is needed to initialize the magnetometer.

7 Claims, 6 Drawing Sheets

(56) References Cited

U.S. PATENT DOCUMENTS

| | | | |
|---|---|---|---|
| 6,826,842 B2 * | 12/2004 | Abe | B82Y 25/00 324/252 |
| 6,831,456 B2 * | 12/2004 | Doescher | G01D 5/145 324/207.21 |
| 7,034,651 B2 * | 4/2006 | Bohlinger | G01R 33/096 324/247 |
| 7,126,330 B2 * | 10/2006 | Peczalski | B82Y 25/00 324/247 |
| 7,358,722 B2 * | 4/2008 | Peczalski | B82Y 25/00 324/247 |
| 7,646,196 B2 * | 1/2010 | Shoji | B82Y 25/00 324/249 |
| 7,737,687 B2 * | 6/2010 | Na | G01R 33/05 324/249 |
| 8,195,423 B2 * | 6/2012 | Von Zon | B82Y 25/00 702/154 |
| 8,237,436 B2 * | 8/2012 | Boeve | B82Y 25/00 324/252 |
| 8,680,857 B2 * | 3/2014 | Phan Le | G01R 33/096 324/207.21 |
| 8,952,471 B2 * | 2/2015 | Doogue | B82Y 25/00 257/422 |
| 2002/0180432 A1 * | 12/2002 | Torok | B82Y 25/00 324/252 |
| 2003/0057938 A1 * | 3/2003 | Goetz | G01R 33/096 324/117 R |
| 2003/0151406 A1 * | 8/2003 | Wan | G01R 33/096 324/252 |
| 2003/0169039 A1 * | 9/2003 | Kang | G01R 33/05 324/260 |
| 2004/0137275 A1 * | 7/2004 | Jander | B82Y 25/00 428/811.5 |
| 2006/0132125 A1 * | 6/2006 | Withanawasam | G01R 33/09 324/252 |
| 2006/0215332 A1 * | 9/2006 | Pappas | G01R 33/09 360/327 |
| 2007/0085535 A1 * | 4/2007 | Na | G01R 33/05 324/253 |
| 2009/0108841 A1 * | 4/2009 | Abe | G01C 17/38 324/252 |
| 2009/0121819 A1 * | 5/2009 | Haratani | G01R 33/09 336/221 |
| 2009/0309588 A1 * | 12/2009 | Nieuwenhuis | B82Y 25/00 324/232 |
| 2010/0013471 A1 * | 1/2010 | Boeve | B82Y 25/00 324/252 |
| 2010/0033175 A1 * | 2/2010 | Boeve | B82Y 25/00 324/252 |
| 2010/0134101 A1 * | 6/2010 | Riva | G01R 33/07 324/251 |
| 2011/0227569 A1 * | 9/2011 | Cai | B82Y 25/00 324/252 |
| 2012/0001631 A1 * | 1/2012 | Espy | G01N 24/08 324/309 |
| 2012/0161759 A1 * | 6/2012 | Pozzati | B82Y 25/00 324/252 |
| 2012/0248888 A1 * | 10/2012 | Kesler | H03H 7/40 307/104 |
| 2013/0082699 A1 * | 4/2013 | Fu | G01R 33/096 324/252 |
| 2013/0099783 A1 * | 4/2013 | Kubik | G01R 33/096 324/252 |

* cited by examiner

MAGNETOMETER WITH ANGLED SET/RESET COIL

CROSS-REFERENCE TO RELATED APPLICATION

This application claims priority of U.S. Provisional Patent Application Ser. No. 61/645,820 for "Magnetometer With Angled Set/Reset Coil," filed May 11, 2012.

STATEMENT REGARDING FEDERALLY SPONSORED RESEARCH OR DEVELOPMENT

N/A

BACKGROUND OF THE INVENTION

As is well known, anisotropic magnetoresistance (AMR) causes a change in resistance of a thin strip of ferrous material when a magnetic field is applied perpendicular to a current flowing in the strip. Magnetic field sensors based on AMR characteristic of ferrous materials are also well known, as is the fact that these types of magnetometers need to apply an external magnetic field in order to set or reset the magnetic domain structure of the device after a large magnetic field disruption. The set/reset (S/R) field is usually generated by conductive coils either underneath or above the plane of the magnetic field sensing layer of the device. Based on Ampere's law, the field generated by the conductive coils is proportional to the current applied, thus, current strength is directly proportional to set or reset efficiency. Higher currents, however, come with a power consumption penalty that may outweigh any increase in sensor reliability or accuracy.

The modern electronic compass requires the magnetometer to be effectively used in a relatively high magnetic field environment, such as those found in smart phones or tablet computers. Increasing the effectiveness, however, usually requires a stronger set/reset field, which would be generated by a higher current and, therefore, would increase power consumption.

What is needed, therefore, is an accurate magnetic field sensor that is small in size, of low cost, that requires low power as is necessitated by mobile device applications, is easy to use and that is easily incorporated into a mobile device.

BRIEF SUMMARY OF THE INVENTION

A magnetometer with a set/reset coil having portions that cross portions of sensing strips at an angle in order to create a magnetic field in the sensing strip that is at an angle with respect to the easy axis of magnetization of the sensing strip. Each sensing strip may have a portion having a magnetic field created therein that is different from a magnetic field created in another portion of the same sensing strip. As a result, a lower set/reset coil current is needed to initialize the magnetometer.

One embodiment of the present invention is a magnetometer with a plurality of sensing strips disposed in a planar substrate where each sensing strip has a long axis. A planar set/reset coil is disposed on the planar substrate parallel and adjacent to the plurality of sensing strips and a first coil portion of the set/reset coil is oriented with respect to a first portion of a first sensing strip at a first angle +α, where 0°<α<90°, with respect to a virtual line or axis perpendicular to the long axis of the first sensing strip.

BRIEF DESCRIPTION OF THE SEVERAL VIEWS OF THE DRAWINGS

Embodiments of the present invention may be better understood by referring to the following description in conjunction with the accompanying drawings in which.

It will be appreciated that for simplicity and clarity of illustration, elements shown in the drawings have not necessarily been drawn accurately or to scale. For example, the dimensions of some of the elements may be exaggerated relative to other elements for clarity or several physical components may be included in one functional block or element. Further, where considered appropriate, reference numerals may be repeated among the drawings to indicate corresponding or analogous elements. Moreover, some of the blocks depicted in the drawings may be combined into a single function.

DETAILED DESCRIPTION OF THE INVENTION

This application claims priority of U.S. Provisional Patent Application Ser. No. 61/645,820 for "Magnetometer With Angled Set/Reset Coil," filed May 11, 2012, the entire contents of which is incorporated by reference herein for all purposes.

In the following detailed description, numerous specific details are set forth in order to provide a thorough understanding of the embodiments of the present invention. It will be understood by those of ordinary skill in the art that these embodiments of the present invention may be practiced without some of these specific details. In other instances, well-known methods, procedures, components and structures may not have been described in detail so as not to obscure the embodiments of the present invention.

Prior to explaining at least one embodiment of the present invention in detail, it is to be understood that the invention is not limited in its application to the details of construction and the arrangement of the components set forth in the following description or illustrated in the drawings. The invention is capable of other embodiments or of being practiced or carried out in various ways. Also, it is to be understood that the phraseology and terminology employed herein are for the purpose of description only and should not be regarded as limiting.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable sub-combination.

Figure 6:
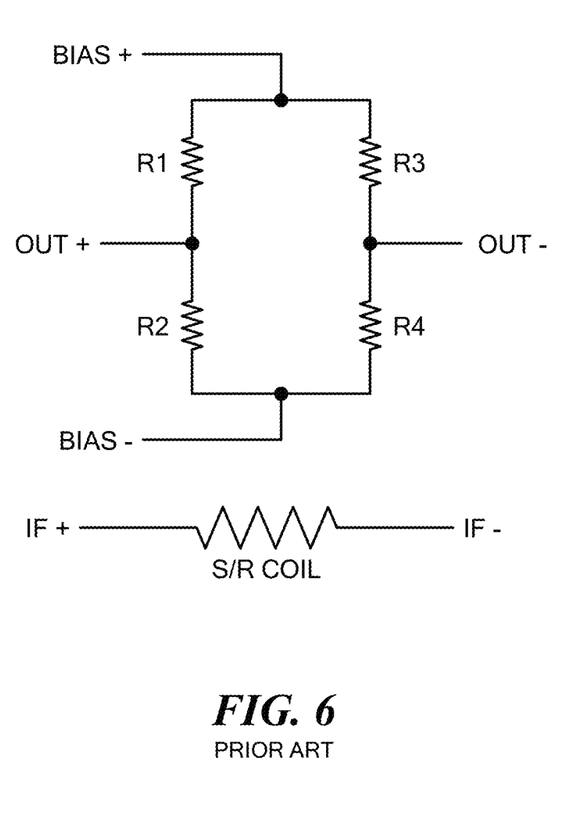
FIG. 6 shows an electrical schematic of a known Wheatstone Bridge.

As is well known in the art, and with reference to FIG. 6, four AMR resistors R1-R4 are constructed into a Wheatstone bridge configuration. The circuit shown in FIG. 6 represents one sensor and is meant to detect magnetization in one magnetic field axis when appropriately oriented. In order to detect the magnetic field in each of the X, Y and Z axes, three such circuits would be provided, and oriented, with respect to each other in order to make such measurements.

Each AMR resistor has the same resistance when no magnetic field is applied. An applied bridge voltage causes current to flow through the resistors and a cross-applied magnetic field will change the resistance in pairs of resistors in the bridge. An output of the bridge is, therefore, proportional to the applied magnetic field. In the presence of an external magnetic field, the resistance of the AMR resistors changes in accordance with the magnetic field magnitude and polarity so that a differential voltage signal appears on the two output nodes OUT+ and OUT−.

A magnetic field sensor based on AMR technology is known to include a thin film permalloy material deposited on a silicon wafer while a strong magnetic field is applied to create permalloy resistors, i.e., the AMR resistors in the bridge configuration. The magnetic domains of these permalloy resistors are aligned in the same direction as the applied field thereby establishing a magnetization vector. Subsequent lithographic and etching steps define the geometry of the AMR resistors.

Figure 1:
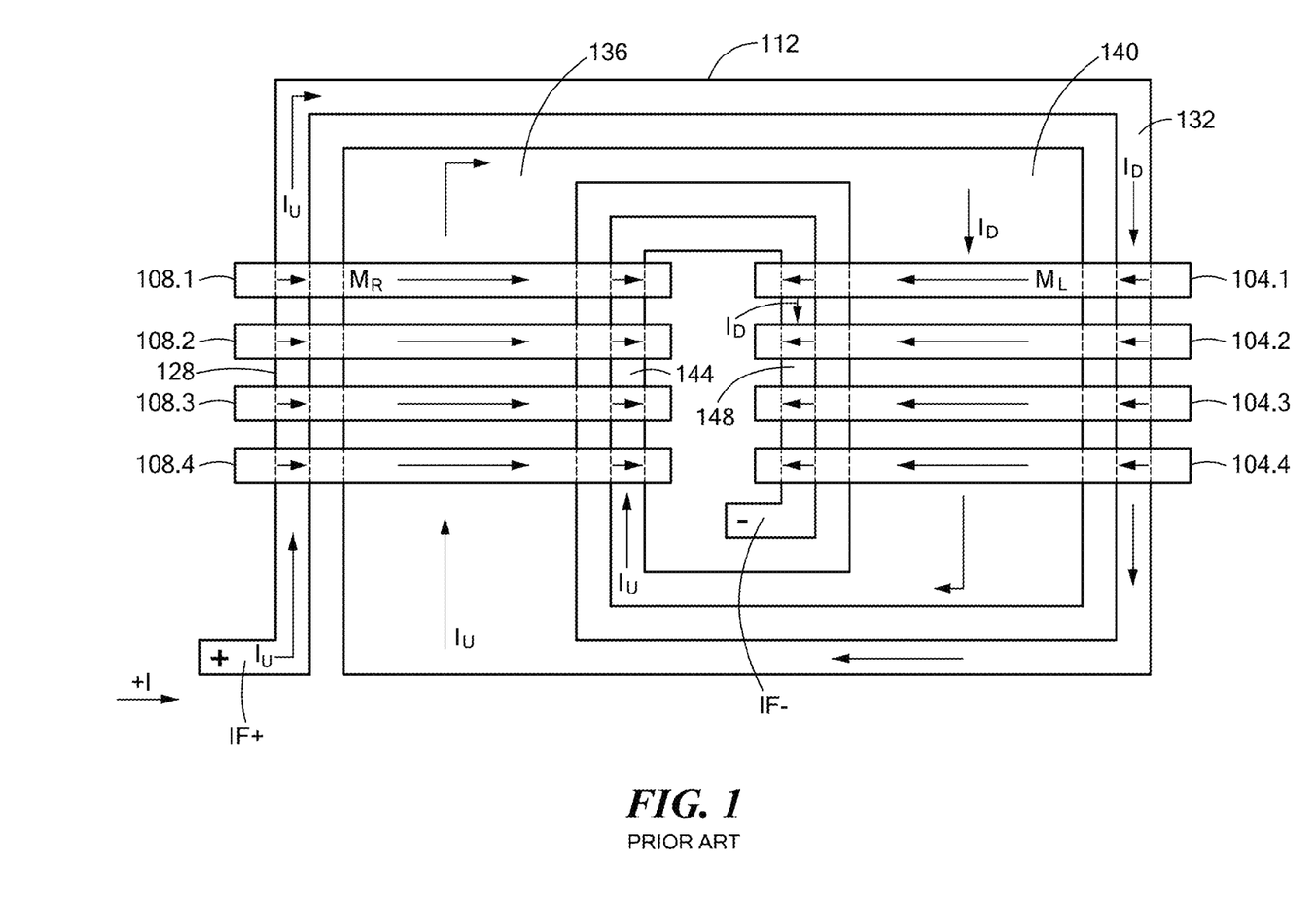
FIG. 1 is a known arrangement of a set/reset coil provided with respect to permalloy strips.

Known AMR magnetometers in the market use set/reset coils having portions that are perpendicular to a sensor long axis so the generated magnetic field is parallel to the long axis. Thus, referring to FIG. 1, representing a known configuration, a plurality of right-side permalloy strips 104.1 . . . 104.4 and a plurality of left-side permalloy strips 108.1 . . . 108.4 are provided co-planar with one another. As is known, although not shown, the left-side and right-side strips 104.*n*, 108.*n* are connected to one another, with appropriate voltage input, and outputs in the form of a Wheatstone bridge.

A set/reset (S/R) coil 112 is provided adjacent to the pluralities of left-side strips 108.*n* and right-side strips 104.*n* in a separate plane that is effectively parallel to the plane of the permalloy strips. The S/R coil 112 plane is shown herein as being "below" the plane of the strips in FIG. 1 merely for clarity of explanation, however, and the concept of "above" or "below" is, therefore, relative.

Referring to FIG. 1, the S/R coil 112 includes an IF+ lead and an IF− lead. By convention in this specification, a current +I introduced at the IF+ lead would produce a current flowing in the direction I$_U$ in first, third and fifth coil portions 128, 136, 144 and a current flowing in the direction I$_D$ in second, fourth and sixth coil portions 132, 140, 148. Consequently, the current +I flowing through the S/R coil 112 will present a predetermined magnetization vector M$_R$ in the left-side permalloy strips 108.*n*, essentially parallel to a long axis of the left-side permalloy strips 108.*n*, and will present a predetermined magnetization vector M$_L$ in the right-side permalloy strips 104.*n*, essentially parallel to a long axis of the right-side permalloy strips 104.*n*. One of ordinary skill in the art understands that if a current −I is introduced at the IF+ lead, the vectors in the left-side in right-side strips will be reversed.

The generated magnetization vectors M$_R$ and M$_L$ are essentially parallel to the long axis of the strips 108.*n* and 104.*n*, respectively, because the coil portions of the S/R coil 112 are at right angles to the long axes of these strips. Thus, the current through the S/R coil 112 is used to initialize the magnetization vectors of the strips and initialize the Wheatstone bridge for measurements.

Thus, the known S/R coil 112 flips the magnetic domains of the strips in opposite directions. As a result of this flipping, the measurement signal changes polarity as well. The sensor offsets due to resistor manufacturing tolerances remain the same value, however, but by subtracting the two readings, the offset error can be eliminated from the output signal.

It is known, however, that the operation of the S/R coil 112 requires a significant amount of current in order to affect the magnetization of the strips. This requirement is a disadvantage in, for example, mobile, handheld and other similar applications where low power consumption is important in order to maximize battery life and, therefore, operating time.

Modern electronic compasses need a magnetometer with a higher linear range for use in a relatively high magnetic field environment, such as in smart phones. Even though the earth's magnetic field is less than one gauss, the electronics in smart phones could generate a magnetic field in a range from a few to ten gauss. One way to increase an AMR magnetometer's dynamic range is to increase its shape anisotropy. Unfortunately, the linear range increase may require a higher set/reset field, which needs to be generated by a higher current with its power consumption drawbacks. So, a mechanism other than simply adding more power to the coils is needed for practical applications.

Based on Stoner-Wohlfarth theory, a uniform magnetic particle can be switched much more easily when the magnetic field is applied to it at an angle between zero and 90 degrees. A magnetic film strip, for example, permalloy, however, is different from the case of uniform particles as the magnetic domain switching occurs through domain wall nucleation and propagation. The domain nucleation process also depends on the angle between an applied magnetic field and a sensor easy axis (long axis).

As represented in Equation 1, the magnetic field h$_S$ changes as a function of an angle α with respect to a line normal to the long axis of the magnetic strip.

$$h_s = \frac{1}{(\cos^{2/3}\alpha + \sin^{2/3}\alpha)^{3/2}} \quad \text{Equation 1}$$

Figure 7:
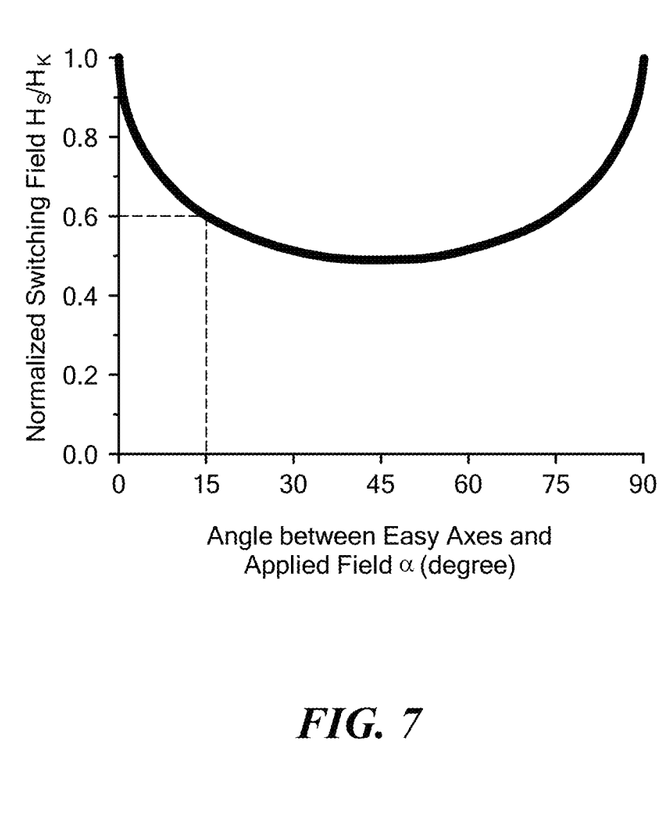
FIG. 7 is a graph representing a normalized switching field of $H_S/H_K$, where $H_S$ is an applied magnetic field and $H_K$ is the anisotropy of a permalloy strip.

As shown in FIG. 7, representing a normalized switching field of H$_S$/H$_K$, where H$_S$ is an applied magnetic field and H$_K$ is the anisotropy of a permalloy strip, one can see that when the magnetic field H$_S$ is applied at an angle of 15 degrees, for example, with respect to the easy axis, the field required to switch, i.e., to generate a domain wall, can be reduced by 40%. As magnetic field strength is proportional to applied current, this also means that 40% less current is needed.

One consideration is, when the field is applied at an angle other than at zero degrees, i.e., perpendicular to the long axis, whether or not the magnetic domain in the strip will remain tilted after the field is removed by stopping the current. First of all, the sensor strip has a high aspect ratio, i.e., it is very long and very narrow or thin, and the magnetic domains are strongly coupled to each other because there is no decoupling boundary applied. After the field is removed, a majority of the domains will follow the easy axis, shape anisotropy, direction. In some instances, the domain will remain tilted because of local pinning or locally high anisotropy as even a field applied at zero degrees instead of a tilted field will stay tilted after the field is applied. It has been determined that as long as the angle is relatively small, the approach described herein provides advantages over the known approaches.

Figure 2:
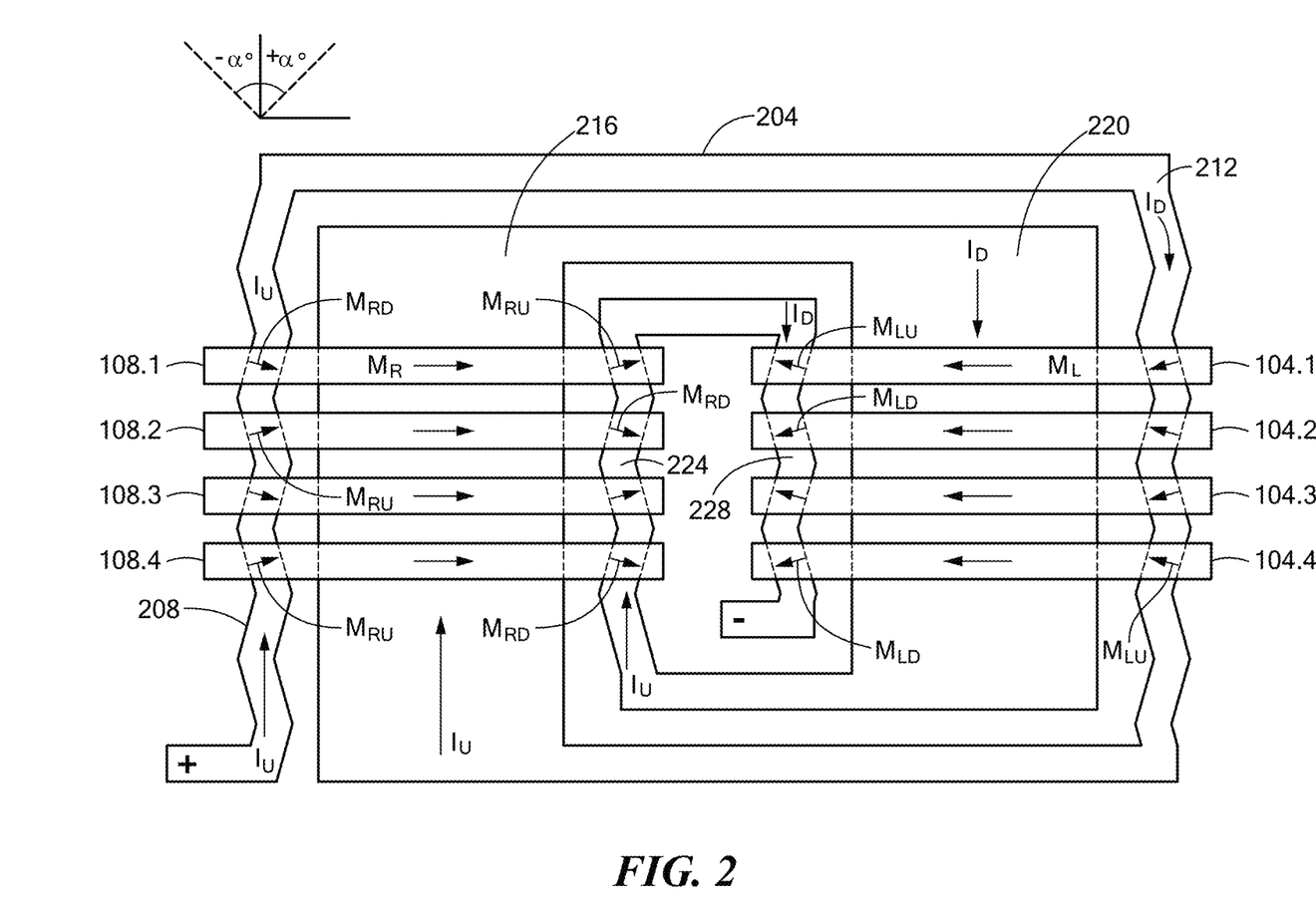
FIG. 2 shows a magnetometer with an angled set/reset coil in accordance with an embodiment of the present invention.

Referring now to FIG. 2, an S/R coil 204 in accordance with an embodiment of the present invention incorporates legs that "zig-zag," i.e., are undulating in that portions have an angular shape that turns in alternating directions in order to cross portions of the permalloy strips at a predetermined angle α with respect to the line normal to the long axis of the permalloy strip.

Figure 3A:
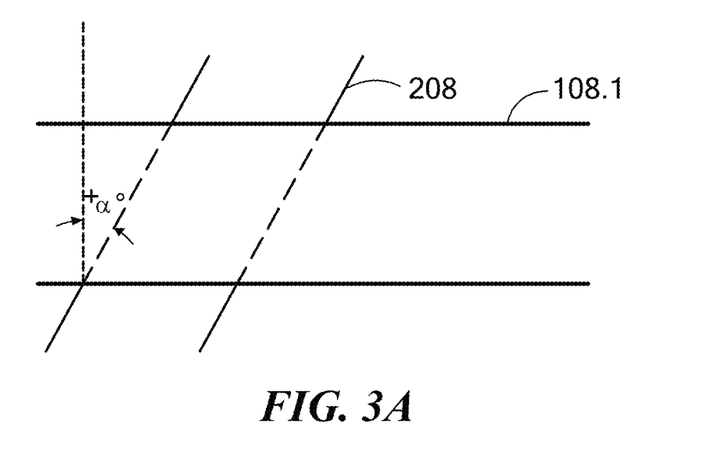
FIGS. 3A and 3B represent angular orientations of the set/reset coils.
Figure 3B:
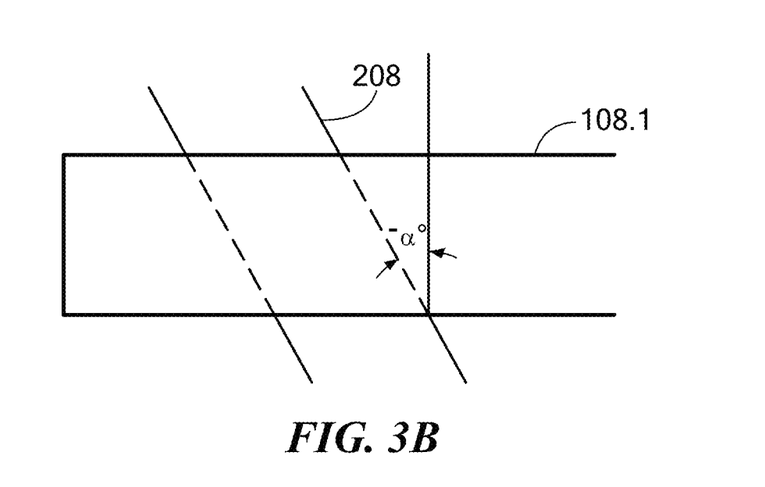

Thus, as a convention in this specification, referring to FIGS. 3A and 3B, a leg of the S/R coil 204 that crosses a permalloy strip 108.n or 104.n at a right angle, i.e., perpendicular to the long axis of the strip, will be considered to be crossing at an angle of 0°. Therefore, the angle of tilt will either be +α or −α with respect to the perpendicular line, where (0°<α<90°). This will be better understood in the description of the various embodiments to follow.

Returning to FIG. 2, the S/R coil 204 includes six SR legs 208, 212, 216, 220, 224 and 228 that cross portions of the left-side strips 108.n and the right-side strips 104.n. The SR legs 208, 216 and 224 cross portions of the left-side strips 108.n and the SR legs 212, 220 and 228 cross portions of the right-side strips 104.n. The SR portions 216 and 220 cross the middle portions of the left-side strips 108.n and the right-side strips 104.n, respectively.

The SR legs 208 and 224 cross first and second end portions of each of the left-side strips 108.n, respectively, at opposite angles −α and +α but alternate with respect to adjacent strips. The SR leg 216 crosses a middle portion of each left-side strip 108.n at a right angle, i.e., α=0°. The SR leg 216 is much wider than the SR legs 208, 224 and covers a much wider section of the left-side strips 108.n. The width of the middle portion is anywhere from 3-6 times wider than each side portion and, therefore, covers most of the permalloy strip.

As a result, for example, in the left-side strips 108.n, a current $+I_U$ introduced at the IF+ lead of the SR coil 204 will induce a magnetization vector $M_{RU}$ in a left end portion of the left-side strip 108.4, a magnetization vector $M_R$ in a middle portion of the strip 108.4 and a magnetization vector $M_{RD}$ in a right end portion of the strip 108.4. These magnetization vectors will alternate in the left-side strips 108.n as shown.

In the right-side strips 104.n, a current $+I_U$ introduced at the IF+ lead of the SR coil 204 will induce a magnetization vector $M_{LD}$ in a left end portion of the right-side strip 104.4, a magnetization vector $M_L$ in a middle portion of the strip 104.4 and a magnetization vector $M_{LU}$ in a right end portion of the strip 104.4. These magnetization vectors will alternate in the right-side strips 104.n as shown.

As above, the strips are set up as a Wheatstone Bridge circuit where, for example, left-side strips 108.1 and 108.4 are in series with one another to form a first leg, and left-side strips 108.2 and 108.3 are in series with one another to form a second leg, right-side strips 104.1 and 104.4 are in series with one another to form a third leg and right-side strips 104.2 and 104.3 are in series with one another to form a fourth leg.

Of course, if the current were reversed, i.e., $-I_U$, then the magnetization vectors would also be reversed.

With the SR coil 204, the left and right portions of each permalloy strip 108.n and 104.n are magnetized at different angles, respectively. The middle portion of each strip 108.n and 104.n is magnetized along the respective easy-axis.

Figure 4:
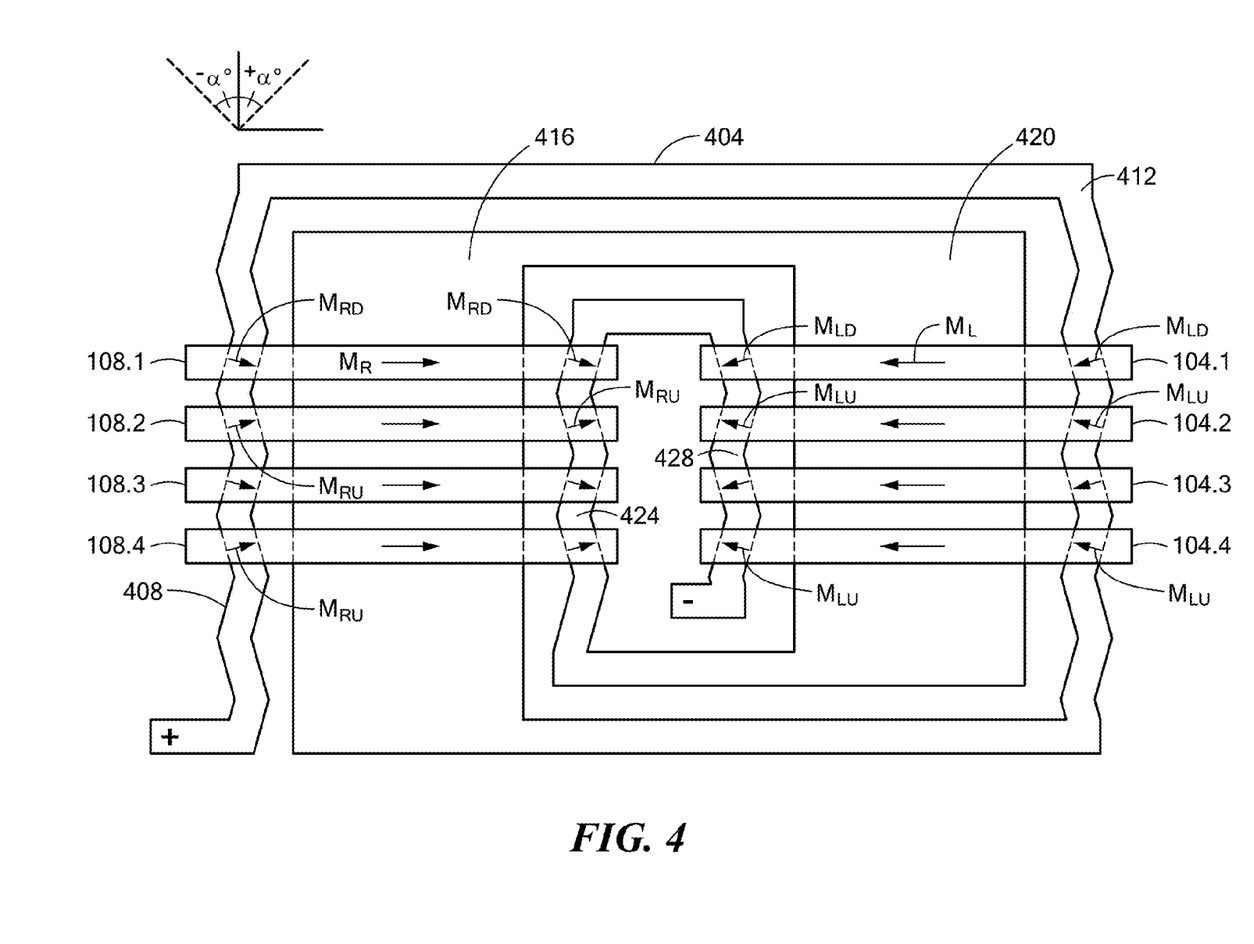
FIG. 4 shows a magnetometer with an angled set/reset coil in accordance with another embodiment of the present invention.

In another embodiment of the present invention, as shown in FIG. 4, and different from the one shown in FIG. 2, the left and right portions of each permalloy strip 108.n and 104.n are magnetized at the same angles, respectively. The middle portion of each strip 108.n and 104.n is magnetized along the respective easy-axis.

Referring now to FIG. 4, an S/R coil 404 provides for magnetization of the left and right portions of each permalloy strip 108.n and 104.n at the same angle, i.e., parallel to each other. The middle portion of each strip 108.n and 104.n is still magnetized along the easy-axis.

The S/R coil 404 includes six SR legs 408, 412, 416, 420, 424 and 428 that cross portions of the left-side strips 108.n and the right-side strips 104.n. The SR legs 408, 416 and 424 cross portions of the left-side strips 108.n and the SR legs 412, 420 and 428 cross portions of the right-side strips 104.n. The SR portions 416 and 420 cross the middle portions of the left-side strips 108.n and the right-side strips 104.n The SR legs 408 and 424 cross first and second end portions of each of the left-side strips 108.n, respectively, at the same angle, either −α or +α, but alternate with respect to adjacent strips. The SR leg 416 crosses a middle portion of each left-side strip 108.n at a right angle, i.e., α=0°. The SR leg 416 is much wider than the SR legs 408, 424 and covers a much wider section of the left-side strips 108.n.

As a result, for example, in the left-side strips 108.n, a current $+I_U$ introduced at the IF+ lead of the SR coil 404 will induce a magnetization vector $M_{RU}$ in a left end portion of the left-side strip 108.4, a magnetization vector $M_R$ in a middle portion of the strip 108.4 and a magnetization vector $M_{RU}$ in a right end portion of the strip 108.4. These magnetization vectors will alternate in adjacent strips in the left-side strips 108.n as shown.

In the right-side strips 104.n, a current $+I_U$ introduced at the IF+ lead of the SR coil 404 will induce a magnetization vector $M_{LU}$ in a left end portion of the right-side strip 104.4, a magnetization vector $M_L$ in a middle portion of the strip 104.4 and a magnetization vector $M_{LU}$ in a right end portion of the strip 104.4. These magnetization vectors will alternate in adjacent strips in the right-side strips 104.n as shown. The left-side and right-side strips are similarly connected as described above to create the Wheatstone Bridge circuit.

As described above, the tilted coils 204, 404 can be used to start the domain wall at the end portions of the permalloy strips 108.n, 104.n. The perpendicular portions drive the domain wall propagation for the middle portions of the strips, which is also the sensing portion. As a result, the sensing elements will have the same magnetic domain configuration as in the non-tilted coil case.

Figure 5:
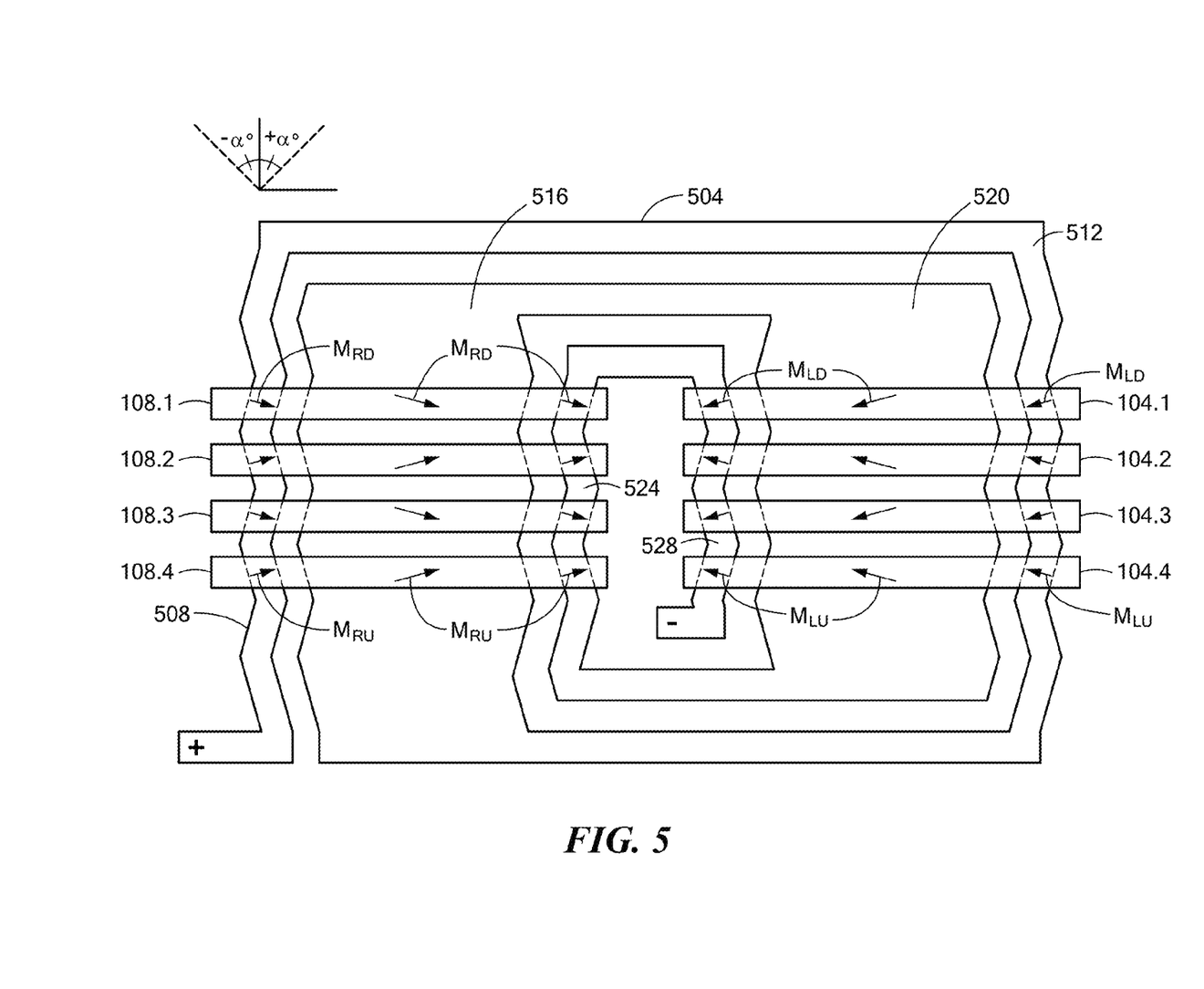
FIG. 5 shows a magnetometer with an angled set/reset coil in accordance with a further embodiment of the present invention.

In another embodiment of the present invention, as shown in FIG. 5, and different from the ones shown in FIGS. 2 and 4, the left, middle and right portions of each permalloy strip 108.n and 104.n are all magnetized at the same angle.

Referring now to FIG. 5, an S/R coil 504 is configured to provide the left, middle and right portions of each permalloy strip 108.n, 104.n with a same magnetization vector, i.e., all vectors on a strip are parallel to one another.

The S/R coil 504 includes six SR legs 508, 512, 516, 520, 524 and 528 that cross portions of the left-side strips 108.n and the right-side strips 104.n. The SR legs 508, 516 and 524 cross portions of the left-side strips 108.n and the SR legs 512, 520 and 528 cross portions of the right-side strips 104.n. The SR portions 516 and 520 cross the middle portions of the left-side strips 108.n and the right-side strips 104.n The SR legs 508, 516 and 524 cross first and second end portions of each of the left-side strips 108.n, respectively, at the same angle, either −α or +α. The SR leg 516 is much wider than the SR legs 508, 524 and covers a much wider section of the left-side strips 108.n.

As a result, for example, in the left-side strips 108.n, a current $+I_U$ introduced at the IF+ lead of the SR coil 504 will induce a magnetization vector $M_{RU}$ in a left end portion of the left-side strip 108.4, a magnetization vector $M_{RU}$ in a middle portion of the strip 108.4 and a magnetization vector $M_{RU}$ in a right end portion of the strip 108.4. These magnetization vectors will alternate from adjacent strips in the left-side strips 108.$n$ as shown.

In the right-side strips 104.$n$, a current $+I_U$ introduced at the IF+ lead of the SR coil 504 will induce a magnetization vector $M_{LU}$ in a left end portion of the right-side strip 104.4, a magnetization vector $M_{LU}$ in a middle portion of the strip 104.4 and a magnetization vector $M_{LU}$ in a right end portion of the strip 104.4. These magnetization vectors will alternate from adjacent strips in the right-side strips 104.$n$ as shown. The left-side and right-side strips are similarly connected as described above to create the Wheatstone Bridge circuit.

Advantageously, when the magnetic fields in a strip are parallel to each other, the additional benefit of reduced switching current should be attainable.

It is also considered that other configurations are available. For example, the structures described above may be augmented with strips that are magnetized along the easy axis in all portions of the strip by providing multiple groups of left-side and right-side strips.

Of course, one of ordinary skill in the art will understand that the set/reset coil configurations shown herein are for explanatory purposes only. The geometry of an S/R coil could be different from that shown but still cross the permalloy strips at the appropriate angle. For example, depending on how the strips are coupled to one another, or arranged, a portion of the S/R coil may cross two permalloy strips at the appropriate angle thereby possibly saving space on the die or providing some other layout advantage.

Embodiments of the present invention, as described herein provide for improved set/reset operation efficiency by building set/reset coils that are at a pre-specified angle with respect to a sensor strip long axis. These configurations can be applied to AMR, GMR, or TGMR (MTJ) based sensor systems.

Having thus described several features of at least one embodiment of the present invention, it is to be appreciated that various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A magnetometer, comprising:
 a first plurality of sensing strips disposed on a planar substrate, each sensing strip having a long axis and first, second and third portions, arranged adjacent to one another with respective long axes substantially parallel to one another;
 a planar set/reset coil, disposed on the planar substrate parallel and adjacent to the first plurality of sensing strips, having a plurality of undulating coil legs;
 wherein a first coil leg is oriented to cross a respective first portion of each sensing strip in the first plurality of sensing strips at angles $\alpha$ alternatingly in sense with respect to adjacent sensing strips, where $0°<\alpha<90°$ with respect to a virtual line perpendicular to the long axis of each sensing strip;
 wherein a second coil leg is oriented to cross a respective second portion of each sensing strip in the first plurality of sensing strips at angle $\alpha$, alternatingly with respect to adjacent sensing strips, where $0°<\alpha<90°$ with respect to a virtual line perpendicular to the long axis of each sensing strip;
 wherein a third coil leg is oriented to cross a respective third portion of each sensing strip in the first plurality of sensing strips;
 wherein the first and second portions of each first sensing strip are first and second end sections of each first sensing strip, respectively, and the third portion is a middle section of each first sensing strip;
 a second plurality of sensing strips disposed on the planar substrate, each sensing strip having a long axis and first, second and third portions, arranged adjacent to one another with respective long axes substantially parallel to one another,
 wherein the first and second pluralities of sensing strips are arranged in equal columns,
 wherein a fourth coil leg is oriented to cross a respective first portion of each sensing strip in the second plurality of sensing strips at angles $\alpha$ alternatingly in sense with respect to adjacent sensing strips where $0"<\alpha<90°$ with respect to a virtual line perpendicular to the long axis of each sensing strip;
 wherein a fifth coil leg is oriented to cross a respective second portion of each sensing strip in the second plurality of sensing strips at angles $\alpha$ alternatingly in sense with respect to adjacent sensing strips where $0"<\alpha<90°$ with respect to a virtual line perpendicular to the long axis of each sensing strip; and
 wherein a sixth coil is oriented to cross a respective third portion of each sensing strip in the second plurality of sensing strips.

2. The magnetometer of claim 1, wherein:
 a width of the third coil leg is larger than a respective width of each of the first and second coil legs.

3. The magnetometer of claim 1, wherein:
 a second coil leg is oriented to cross a respective second portion of each sensing strip in the first plurality of sensing strips at angles $\alpha$ alternatingly with respect to adjacent sensing strips, where $0°<\alpha<90°$ with respect to a virtual line perpendicular to the long axis of each sensing strip.

4. The magnetometer of claim 1, wherein:
 a third coil leg is oriented to cross a respective third portion of each sensing strip in the first plurality of sensing strips substantially perpendicular to the long axis of each sensing strip.

5. The magnetometer of claim 3, wherein:
 a third coil leg is oriented to cross a respective third portion of each sensing strip in the first plurality of sensing strips substantially perpendicular to the long axis of each sensing strip.

6. The magnetometer of claim 1, wherein the first and second pluralities of sensing strips are coupled to one another as a Wheatstone Bridge circuit.

7. A magnetometer, comprising:
 a first plurality of sensing strips disposed on a planar substrate, each sensing strip having a long axis and first, second and third portions, arranged adjacent to one another with respective long axes substantially parallel to one another;
 a planar set/reset coil, disposed on the planar substrate parallel and adjacent to the first plurality of sensing strips, having a plurality of undulating coil legs;
 wherein a first coil leg is oriented to cross a respective first portion of each sensing strip in the first plurality of sensing strips at angles $\alpha$ alternatingly in sense with respect to adjacent sensing strips, where $0°<\alpha<90°$ with respect to a virtual line perpendicular to the long axis of each sensing strip;

wherein the first and second pluralities of sensing strips are arranged in equal columns;

wherein a second coil leg is oriented to cross a respective second portion of each sensing strip in the first plurality of sensing strips at angles $\alpha$, alternatingly with respect to adjacent sensing strips, where $0°<\alpha<90°$ with respect to a virtual line perpendicular to the long axis of each sensing strip, wherein a third coil leg is oriented to cross a respective third portion of each sensing strip in the first plurality of sensing strips;

wherein the first and second portions of each first sensing strip are first and second end sections of each first sensing strip, respectively, and the third portion is a middle section of each first sensing strip.

* * * * *